United States Patent [19]

Fitch et al.

[11] Patent Number: 5,510,645
[45] Date of Patent: Apr. 23, 1996

[54] SEMICONDUCTOR STRUCTURE HAVING AN AIR REGION AND METHOD OF FORMING THE SEMICONDUCTOR STRUCTURE

[75] Inventors: Jon T. Fitch; Papu Maniar; Keith E. Witek; Jerry Gelatos; Reza Moazzami; Sergio A. Ajuria, all of Austin, Tex.

[73] Assignee: Motorola, Inc., Schaumburg, Ill.

[21] Appl. No.: 383,908

[22] Filed: Jan. 17, 1995

Related U.S. Application Data

[60] Continuation of Ser. No. 179,285, Jan. 7, 1994, abandoned, which is a division of Ser. No. 70,613, Jun. 2, 1993, Pat. No. 5,324,683.

[51] Int. Cl.$^6$ .................................................. H01L 29/00
[52] U.S. Cl. ..................... 257/522; 257/410; 257/254; 257/750; 257/276; 257/758; 73/754; 73/724; 73/777
[58] Field of Search ............................... 257/410, 276, 257/522, 750, 736, 254, 419, 758; 73/754, 724, 777; 361/283.4; 437/64, 65

[56] References Cited

U.S. PATENT DOCUMENTS

| | | | |
|---|---|---|---|
| 3,294,988 | 12/1966 | Packard | 257/254 |
| 3,647,585 | 3/1972 | Fritzinger et al. | 257/522 |
| 3,886,584 | 5/1975 | Cook, Jr. et al. | 257/410 |
| 3,923,559 | 12/1975 | Sinha | 257/288 |
| 4,001,871 | 1/1977 | Tsunemitsu | 257/752 |
| 4,169,000 | 9/1979 | Riseman | 257/522 |
| 4,894,698 | 1/1990 | Hijikigawa et al. | 257/244 |
| 4,959,705 | 9/1990 | Lemnios et al. | 257/276 |
| 5,126,817 | 6/1992 | Baba et al. | 257/347 |
| 5,148,260 | 9/1992 | Inoue et al. | 257/762 |
| 5,171,713 | 12/1992 | Matthews | 437/189 |
| 5,232,866 | 8/1993 | Beyer et al. | 437/62 |

FOREIGN PATENT DOCUMENTS

| | | | |
|---|---|---|---|
| 61-172346 | 8/1986 | Japan | 257/522 |
| 63-177469 | 7/1988 | Japan | 257/410 |
| 1-5075A | 1/1989 | Japan | 257/419 |

*Primary Examiner*—Jerome Jackson, Jr.
*Assistant Examiner*—John Guay
*Attorney, Agent, or Firm*—Keith E. Witek

[57] ABSTRACT

A method for forming an air region or an air bridge overlying a base layer (12). Air regions (20a, 20b, 28a, and 48) are formed overlying the base layer (12) to provide for improved dielectric isolation of adjacent conductive layers, provide air-isolated conductive interconnects, and/or form many other microstructures or microdevices. The air regions (20a, 20b, 28a, and 48) are formed by either selectively removing a sacrificial spacer (16a and 16b) or by selectively removing a sacrificial layer (28, 40). The air regions (20a, 20b, 28a, and 48) are sealed, enclosed, or isolated by either a selective growth process or by a non-conformal deposition technique. The air regions (20a, 20b, 28a, and 48) may be formed under any pressure, gas concentration, or processing condition (i.e. temperature, etc.). The air regions (20a, 20b, 28a, and 48) may be formed at any level within an integrated circuit.

11 Claims, 10 Drawing Sheets

SEMICONDUCTOR STRUCTURE HAVING AN AIR REGION AND METHOD OF FORMING THE SEMICONDUCTOR STRUCTURE

This application is a continuation of prior application Ser. No. 08/179,285, filed on Jan. 7, 1994, entitled "A SEMICONDUCTOR STRUCTURE HAVING AN AIR REGION", now abandoned, which is a divisional of prior application Ser. No. 08/070,613, filed on Jun. 2, 1993, entitled "A SEMICONDUCTOR STRUCTURE HAVING AN AIR REGION AND METHOD OF FORMING THE SEMICONDUCTOR STRUCTURE" (original title)" now U.S. Pat. No. 5,324,683.

FIELD OF THE INVENTION

The present invention relates generally to semiconductor technology, and more particularly, to semiconductive structures having an air region.

BACKGROUND OF THE INVENTION

The integrated circuit industry is constantly reducing the separation between conductive layers of material in order to achieve a smaller integrated circuit. By reducing the spacing of conductive materials in an integrated circuit, an increase in a phenomenon known as capacitive crosstalk is observed. Conventional integrated circuits typically use an interconnect structure wherein a first metal line is adjacent a second metal line. If the crosstalk or capacitance between the first metal line and the second metal line is high, then the voltage on the first metal line alters or affects the voltage on the second metal line. This alteration in voltage could cause an integrated circuit to misinterpret logic zeros, logic ones, and voltage levels, and therefore incorrectly process binary and/or analog information. An integrated circuit that incorrectly processes any information is usually totally inoperable.

In order to reduce capacitive coupling and therefore reduce crosstalk, the integrated circuit industry has been developing low dielectric constant (low-K) materials to replace conventional dielectric/insulative materials. Conventional semiconductor insulative materials have a dielectric constant having a value of roughly four. Some new/advanced dielectric materials such as Teflon, organic dielectrics, and the like, may have a dielectric constant between roughly four and two. The use of many low-K dielectric materials is not feasible due to the fact that equipment is not available to properly process the new dielectric materials in various integrated circuits. Also, the chemical or physical properties of many low-K dielectric materials are usually difficult to make compatible or integrate into conventional integrated circuit processing.

Coaxial cable structures and similar structures have been attempted in integrated circuits with little success. A coaxial structure has a first conductor which carries a signal (i.e. a digital signal or an analog signal) and a second conductor surrounding the first conductor which is used to shield the first conductor from other conductors in the integrated circuit. In an integrated circuit, it is very difficult to form a first conductor entirely surrounded by a second conductor. Furthermore, two or more conductive layers are required to form the coaxial structure. Several layers of conductive material are therefore required in order to produce one functional layer of conductive interconnect. Using several conductive layers to form one functional conductive interconnect layer is not substrate surface area effective, manufacturing-throughput effective, or cost-effective in most cases.

In order to attempt to reduce capacitive coupling and resistor/capacitor (RC) delays, superconductive material has been researched in the integrated circuit industry. Superconductors require low temperatures in order to operate properly and are therefore expensive to operate and expensive to maintain. In many cases, superconductive material is highly sensitive to oxygen and must be specially encapsulated in integrated circuits to avoid other oxygen containing areas, such as oxides and the like, from introducing unwanted contamination. Superconductors tend to be brittle, and are therefore not suited to integrated manufacturing. In many cases, a superconductor could not survive the mechanical stresses induced on a semiconductor wafer when manufacturing integrated circuits.

A new method and structure for reducing capacitive crosstalk between conductive regions in a semiconductor device is required.

SUMMARY OF THE INVENTION

The previously mentioned disadvantages are overcome and other advantages achieved with the present invention. In one form, the present invention comprises a method for forming a semiconductor device having an insulating region. A base layer of material is provided. A first conductive element is formed overlying the base layer. The first conductive element has a sidewall. A second conductive element is formed overlying the base layer. The second conductive element has a sidewall and is physically separated from the first conductive element by an opening. A first sidewall spacer is formed laterally adjacent the sidewall of the first conductive element. A second sidewall spacer is formed laterally adjacent the sidewall of the second conductive element. A plug layer is formed within the opening between the first conductive element and the second conductive element. The plug layer exposes a top portion of the first sidewall spacer and a top portion of the second sidewall spacer. Both the first and second sidewall spacer are removed to form an air insulative portion between the first conductive element and the second conductive element.

In another form, the invention comprises a method for forming a semiconductor device having an air region. A base layer is provided. A first layer of material which is resistant to growth is formed overlying the base layer. A growth layer is formed overlying the first layer of material. A second layer of material which is resistant to growth is formed overlying the growth layer. An opening is etched through the first layer, the growth layer, and the second layer. The opening defines a sidewall of the growth layer. The sidewall of the growth layer is selectively grown to form a grown region which closes off a portion of the opening and forms an air region within the opening.

In yet another form, the invention comprises a method for forming a semiconductor device having an air region. A base layer is provided. A patterned layer of material is formed overlying the base layer. The patterned layer of material has a sidewall. A seed layer is formed overlying the patterned layer. A sidewall spacer is formed adjacent the patterned layer of material. An opening having a radius is formed through the seed layer to expose a portion of the patterned layer of material. The patterned layer of material is removed to form said air region. Material is grown onto the seed layer to reduce the radius of the opening.

In yet another form, the invention comprises one or more semiconductor devices or structures formed from the methods recited above.

The present invention will be more clearly understood from the detailed description below in conjunction with the accompanying drawings.

DESCRIPTION OF A PREFERRED EMBODIMENT

Figure 1:
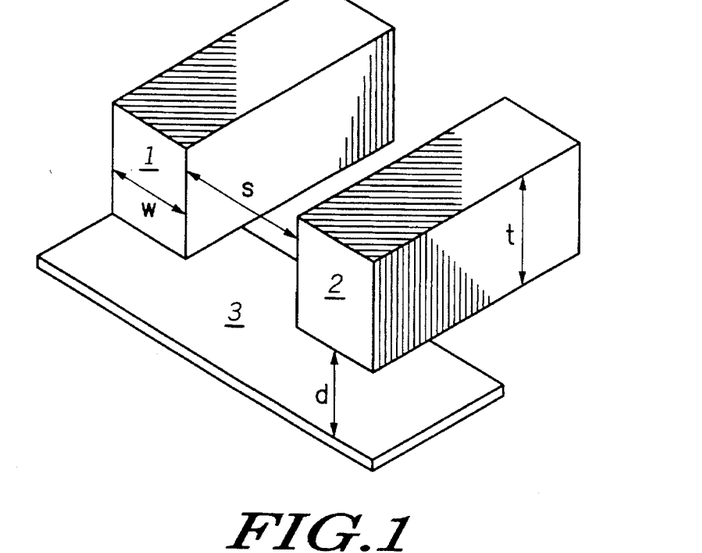
FIG. 1 illustrates, in a three-dimensional perspective, a semiconductor structure having three conductive regions.

Illustrated in FIG. 1 is a three-dimensional perspective of a semiconductor structure having three conductive regions. FIG. 1 depicts a conductive region 1, a conductive region 2 adjacent conductive region 1, and a conductive region 3 underlying both conductive regions 1 and 2. Each of conductive regions 1 and 2 has a width "w", and conductive region 1 is separated from conductive layer 2 by a separation distance "s". Conductive region 3 underlies conductive regions 1 and 2 by a distance "d". A known dielectric material, such as a plasma tetraethylorthosilicate (TEOS) oxide, having a dielectric constant K=4.3 completely surrounds and separates the conductive regions 1, 2, and 3. A quantity known as a pitch (pitch=w+s) is conventionally used to characterize conductive capacitance crosstalk for adjacent metal lines used in the integrated circuit industry.

Figure 2:
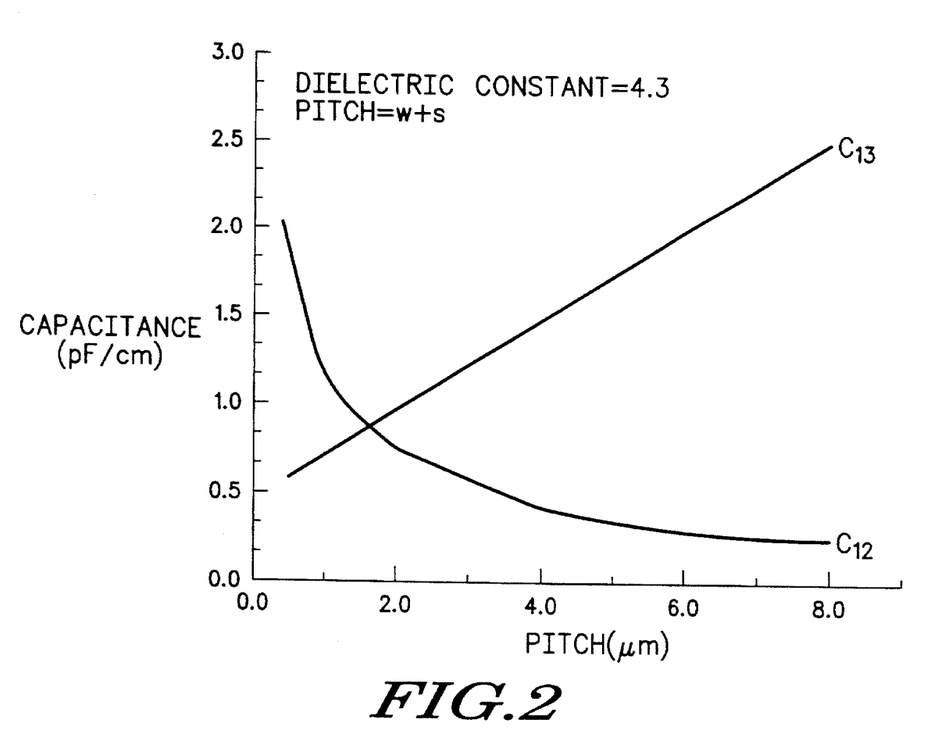
FIG. 2 illustrates in a graph a relationship between conductive region pitch and capacitive coupling for the structure of FIG. 1.

FIG. 2 illustrates a graph of capacitance values, the capacitance being between the conductors of FIG. 1 as a function of physical separation. A reduction of pitch is an ongoing activity in the integrated circuit industry in order to achieve integrated circuits which are more dense and use substrate surface area more efficiently. The capacitance between conductive layers 1 and 2, labeled as $C_{12}$ in FIG. 2, has been experimentally and theoretically found to increase exponentially as pitch is reduced or as the conductive regions 1 and 2 are brought closer together. Conversely, as pitch decreases the capacitive coupling between conductive region 1 and conductive region 3 ($C_{13}$) decreases due to the increased capacitive coupling via $C_{12}$.

The increase in capacitive coupling between conductive regions 1 and 2 is disadvantageous due to a phenomenon known as capacitive crosstalk. Capacitive crosstalk is directly affected by capacitive coupling. For example, if conductive region 1 is separated from conductive region 2 by one hundred microns (i.e. s=100 microns), the coupling capacitance $C_{12}$ is small and virtually no crosstalk occurs. If the pitch is less than approximately one micron, the capacitive coupling $C_{12}$ is high as illustrated in FIG. 2. Due to the high capacitance, the crosstalk phenomenon may render an integrated circuit inoperable.

Crosstalk is a phenomenon wherein, for example, a potential (i.e. a voltage) at conductive region 1 adversely affects/alters the potential at conductive region 2 through capacitive coupling. Assume that the pitch in a microprocessor metal level (i.e. a first metal level) is 2 microns and that the microprocessor has a plurality of data lines and address lines (a 32-bit machine for example). The address and data lines are usually run across the integrated circuit together or in groups of several bits. The conductive regions carrying the groups of several bits are separated by a minimum pitch to conserve substrate surface area. One data or address line may be programmed to carry a logic one (for example, a five volt signal). An adjacent data or address line may be programmed to carry a logic zero (for example, a zero volt signal or ground potential).

Due to the small pitch, capacitive crosstalk allows the logic one value on the first line to effect/alter the logic zero value on the adjacent line and/or vice versa. Therefore, instead of properly carrying a correct logic one value or logic zero value, the address and data lines may incorrectly carry either one volt, two volts, or four volts, or any erroneous voltage value other than an accurate logic one or logic zero. This erroneous voltage value could alter the logical operation of the microprocessor and render the microprocessor inoperable. Crosstalk phenomenon may greater affect the operation of analog circuits such as analog-to-digital (A/D) converters, digital-to-analog (D/A) converters, operational amplifiers (op-amps), filters, transducers, and the like.

In order to maintain a small pitch and achieve a dense integrated circuit, a new dielectric isolation scheme and structure having a lower dielectric constant than conventional materials (K=4.3) must be used between conductive structures to reduce capacitance and therefore reduce crosstalk.

Figure 3:
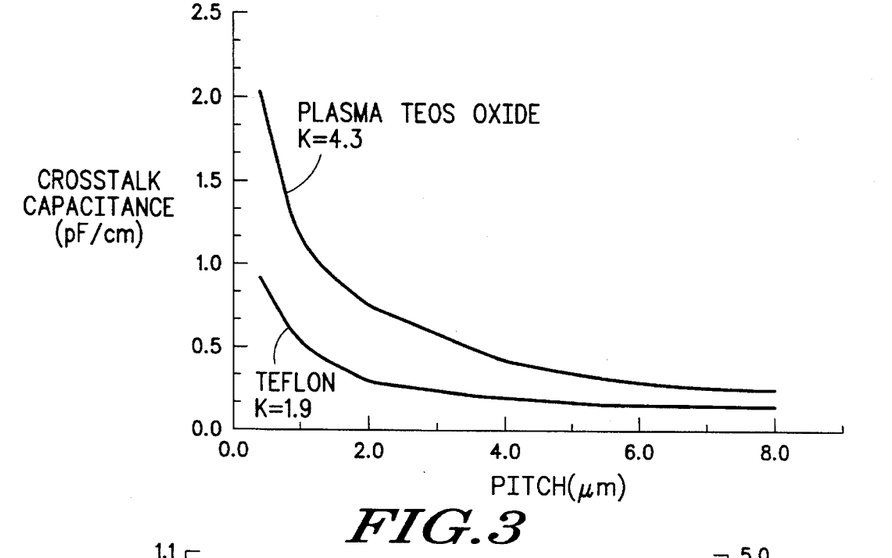
FIG. 3 illustrates in a graph a relationship between conductive region pitch and capacitive crosstalk for a known plasma tetraethylorthosilicate (TEOS) oxide having a dielectric constant of K=4.3 and a known Teflon material having a dielectric constant of K=1.9.

FIG. 3 illustrates that a known Teflon material having a dielectric constant K=1.9 greatly reduces the unwanted crosstalk capacitance when compared to plasma TEOS oxides for a given pitch. Unfortunately, material such as Teflon and other low-K dielectric materials are difficult to process in an integrated circuit environment, are incompatible with conventional integrated circuit processing, are unavailable for use due to the fact that no feasible semiconductor equipment exists for the material, or are not yet fully researched and developed. Therefore, a different material or a different process is required to overcome the crosstalk problem and enable pitch to be further reduced.

Figure 4:
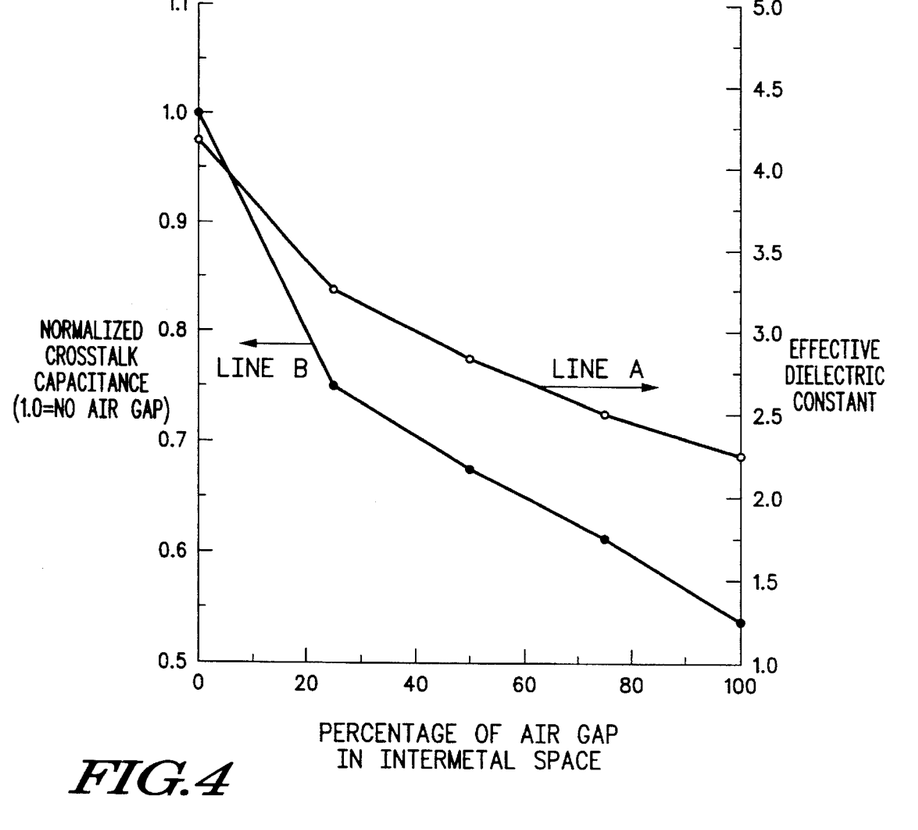
FIG. 4 illustrates in a dual-graph a relationship between air region size and normalized capacitive crosstalk, and illustrates a relationship between air region size and effective dielectric constant of an insulative region in accordance with the present invention.

FIG. 4 illustrates a graph of how an air gap or air region placed between conductive regions affects capacitive coupling and crosstalk in accordance with the present invention. FIG. 4 illustrates a line A which corresponds to the right Y-axis of FIG. 4 labeled "Effective Dielectric Constant." Line B in FIG. 4 corresponds to the left Y-axis of FIG. 4 entitled "Normalized Crosstalk Capacitance." A dielectric layer of plasma TEOS oxide is used as an inter-level dielectric for the curves in FIG. 4. With no air gap (percentage of air gap=0%), the entire isolation between the conductive regions depends upon the TEOS oxide. The dielectric constant of TEOS oxide is K=4.3 which results in a high capacitance as illustrated in FIG. 4. If a 50% air gap is formed between conductors (i.e. if 50% of the TEOS is removed between the conductive regions to form a 50% air region), the effective dielectric constant of the region between the conductive regions reduces to K=2.75 and the capacitance is reduced as illustrated in FIG. 4. The dielectric value K=2.75 is 50% due to air and 50% due to the remaining TEOS regions. Ideally, for isolation purposes, a 100% air gap is desired wherein the capacitance is very low and K is reduced significantly.

It should be noted that the dielectric constant K may be further reduced than that indicated in FIG. 4 by introducing gases or inert gases into the air gap, or by altering the pressure or vacuum conditions of the air gap. An air gap under vacuum has a lower dielectric constant. In theory, an isolation region having a dielectric constant of K=1 may be achieved using a 100% vacuum region. In most cases, an improved dielectric constant is formed when the pressure within an air gap is reduced to less than one Torr.

FIGS. 5–11 illustrate a method which may be used to form an air gap or air region between two conductive regions. The air region formed via the method of FIGS. 5–11 may be any air region within the range of 0% to 100% depending upon specific process parameters.

Figure 5:
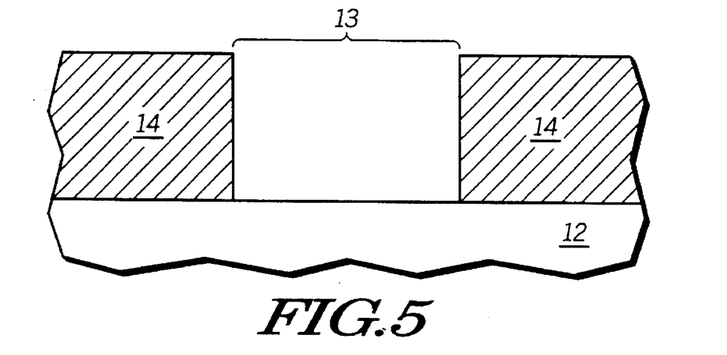
FIGS. 5–11 illustrate, in cross-sectional form, a method for forming a semiconductor structure having an air region in accordance with the present invention.

In FIG. 5, a base layer 12 is provided. Base layer 12 may be a substrate or a layer of material overlying the substrate. A substrate may be made of silicon, gallium arsenide, silicon on sapphire (SOS), epitaxial formations, germanium, germanium silicon, diamond, silicon on insulator (SOI) material, selective implantation of oxygen (SIMOX) substrates, and/or like substrate materials. Preferably, the substrate is made of silicon which is typically single crystalline. Base layer 12 may also be a dielectric layer. Dielectric layers include but are not limited to wet or dry silicon dioxide ($SiO_2$), a nitride material, tetraethylorthosilicate (TEOS) based oxides, borophosphosilicate glass (BPSG), phosphosilicate glass (PSG), borosilicate glass (BSG), oxide-nitride-oxide (ONO), tantalum pentoxide ($Ta_2O_5$), plasma enhanced silicon nitride (P—$SiN_x$), titanium oxide, oxynitride, germanium oxide, a spin on glass (SOG), any chemical vapor deposited (CVD) dielectric, a grown oxide, and/or like dielectric materials.

In general, base layer 12 illustrates that the device resulting from the process of FIGS. 5–11 may be formed at any level within an integrated circuit. The structure of FIG. 11 may also be formed within a trench to form improved substrate trench isolation.

Regions 14 are formed overlying the base layer 12. In a preferred form, the regions 14 are conductive regions such as a metal, a silicide, a salicide, polysilicon, amorphous silicon, a conductive nitride, a ruthenate, a conductive oxide, a conductive organic material, a composite conductive material, or any semiconductor-compatible conductive layer. In another form, the regions 14 may be dielectric regions and be used to form an air region for applications other than the reduction of crosstalk. These other applications are discussed in a subsequent paragraph, whereas air region isolation to reduce crosstalk is discussed in detail below. Each of the regions 14, if conductive, are physically separated from each other by an opening 13. Each of the regions 14 has a sidewall facing the opening 13.

Figure 6:
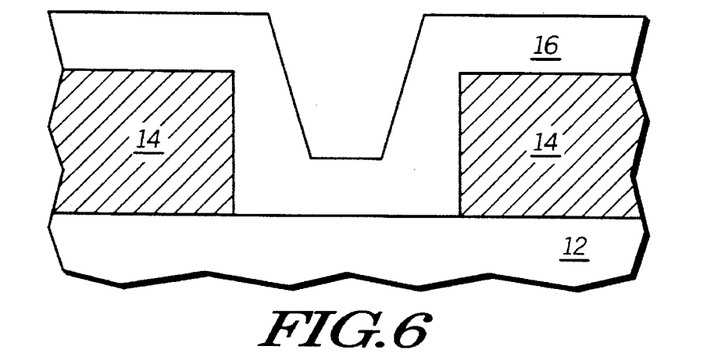

In FIG. 6, a layer of material 16 is formed overlying the regions 14 and the base layer 12. The layer of material 16 is formed as a material which may be etched selective to the regions 14 and the base layer 12. For example, if the base layer 12 is an oxide and the regions 14 are metal, the layer of material 16 may be nitride. If the base layer 12 is silicon, and the regions 14 are polysilicon, then the layer of material 16 may be an oxide. Specifically, the layer of material 16 may be one or more of titanium nitride (TiN), silicon nitride, a nitrided material, borophosphosilicate glass (BPSG), borosilicate glass (BSG), boronitride (BN), boro-oxynitride (BNO), titanium oxide, germanium silicon, germanium oxide, ruthenium oxide, polyimide, an organic material, calcium flouride, barium flouride, strontium flouride, a flourided material, a polymeric material, and a refractory metal.

The materials used for the layer of material 16 may be etched using known chemistries. A dry etch process is used to form sidewall spacers whereas either a dry and/or a wet etch process is used to remove sidewall spacers as discussed below. For example, a dry Cl based environment or a wet $NH_4OH$ and $H_2O_2$ solution may be used to etch a chemical vapor deposited (CVD) TiN or titanium. Wet $H_2O$ may be used to etch a CVD BSG wherein a concentration of $B_2O_3$ used to form the BSG is greater than 55% (i.e. the BSG has a high boron concentration). CVD BN or BNO may be etched using a wet $H_2O_2$ or a wet $H_2O$ solution. A CVD titanium oxide may be etched using a dry $CF_4$ and oxygen environment. A CVD $SiO_2$—$GeO_2$ (silicon oxide - germanium oxide) layer wherein the $GeO_2$ is greater than 50% in concentration, may be etched via a wet $H_2O$ solution. CVD ruthenium oxide and organics may be etched using a dry oxygen ($O_2$) environment. Other known etch chemistries exist in the art for many other materials which are suitable for formation of the layer of material 16.

Figure 7:
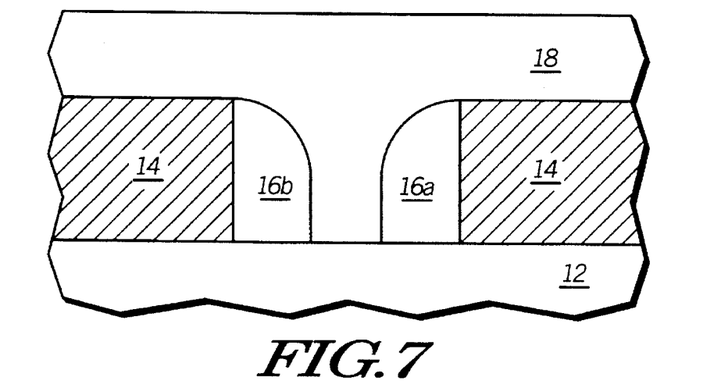

In FIG. 7, an etch step, typically a reactive ion etch (RIE), is used to form sidewall spacers 16a and 16b (sacrificial spacers) from the layer of material 16. If the regions 14 are conductive, spacer 16a surrounds one of the regions 14 and the spacer 16b surrounds another of the regions 14. If regions 14 are a dielectric material, spacers 16a and 16b may physically be one and the same. A dielectric layer 18 is formed overlying the base layer 12, the regions 14, and the spacers 16a and 16b. The dielectric layer 18 may be any dielectric material which is not substantially etched when spacers 16a and 16b are etched. For example, dielectric layer 18 may be a plasma TEOS oxide, and may be formed by either a CVD process, a spin-on process (i.e. a spin on glass (SOG) process), or a like dielectric formation process.

Figure 8:
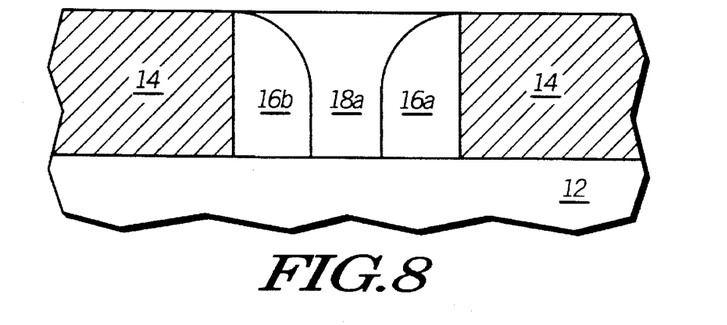

In FIG. 8, a chemical mechanical polishing (CMP) process, a resist etch-back (REB) method, or a like process is used to planarize the dielectric layer 18 to form a plug layer 18a within the opening 13 (opening 13 is illustrated in FIG. 5).

Figure 9:
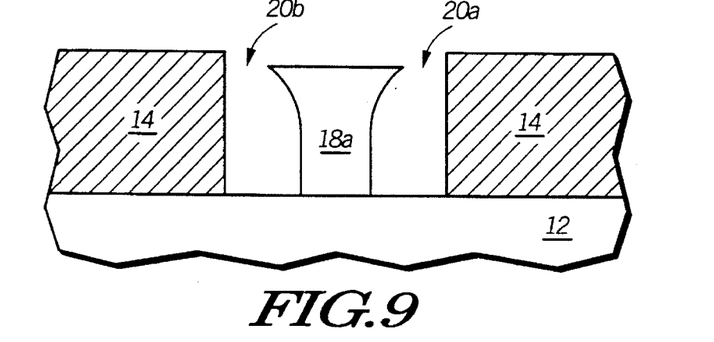

In FIG. 9, an etch chemistry, as discussed previously, is used to remove the spacers 16a and 16b selective to each of the base layer 12, the regions 14, and the plug layer 18a to form air regions 20a and 20b. In some cases, it is preferred to use a water-soluble material as the spacers 16a and 16b to ensure a high etch selectivity to the regions 14 and the base layer 12. In general, an air region may be referred to as either a space, an intentional void, an air gap, an air bridge, a vacuum area, a gaseous region, a cavity of a predetermined volume, a separation region, and the like. Due to the fact that isolation is desired between the regions 14, the base layer 12 may be optionally trenched to deepen the air regions 20a and 20b and improve the isolation between regions 14.

Figure 10:
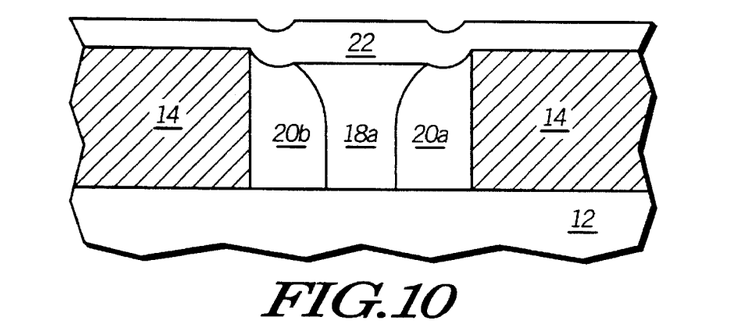

In FIG. 10, a non-conformal inter-level dielectric deposition or a spin-on deposition of a controlled viscosity solution (i.e. an SOG polyimide) is performed to form a dielectric layer 22. Dielectric layer 22 closes off, encapsulates, or isolates the air regions 20a and 20b. A plasma enhanced chemical vapor deposition (PECVD) silane-based chemistry (e.g. $SiH_4$ and $O_2$) may be used to achieve a non-conformal dielectric deposition. During formation of the dielectric layer 22, the air regions 20a and 20b may be exposed to gases or gas compositions other than atmospheric gas compositions, inert gases, vacuum conditions, and/or altered pressures in order to alter the physical, mechanical, and electrical properties (i.e. dielectric constant) of the air regions 20a and 20b. Air regions which are sealed under a vacuum (i.e. less than atmospheric pressure) have reduced dielectric constants.

Figure 11:
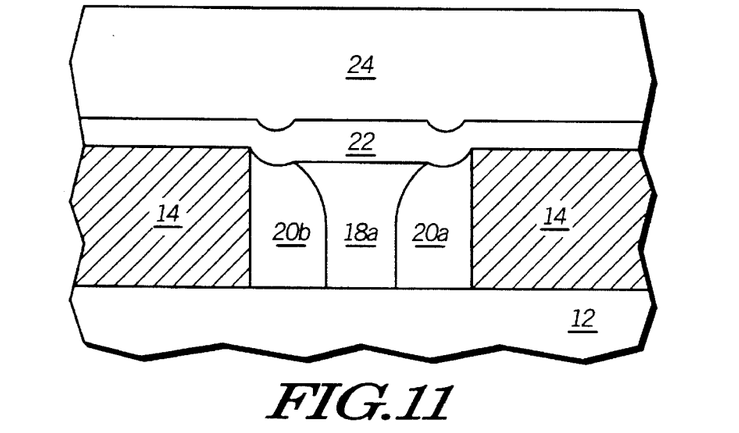

In one form, the dielectric layer 22 may be the only isolation required. In FIG. 11, a thicker dielectric layer 24 is used to provide the bulk of the overlying dielectric isolation whereas the dielectric layer 22 is formed as a thin layer for the express purpose of sealing the air regions 20a and 20b.

FIG. 11 illustrates a structure wherein regions 14 are physically separated/isolated from each other by an isolation region having approximately a 50% air region and a 50% plasma TEOS oxide region. Therefore, according to FIG. 4, the effective dielectric constant of the structure of FIG. 11 is roughly K=2.75 (if region 18a is made of TEOS-based material) which is a significant improvement over no air regions (see 0% air regions in FIG. 4). Using only plasma TEOS to isolate regions 14 results in a dielectric constant of K=4.3 in FIG. 4. Therefore, the air regions have reduced capacitance, reduced crosstalk, and allow for integrated circuit pitches to be further reduced while the integrated circuit remains operational and functional. Spacers are reasonably and reliably made having a width from roughly 300 Angstroms to 3000 Angstroms. Depending upon the width of the spacers 16a and 16b, the air regions 20a and 20b may be made to be, for example, 20%, 40%, 60%, or 80%, of the total isolation between regions 14. In general, almost any percentage of air region may be formed using an appropriately sized spacer.

Figure 12:
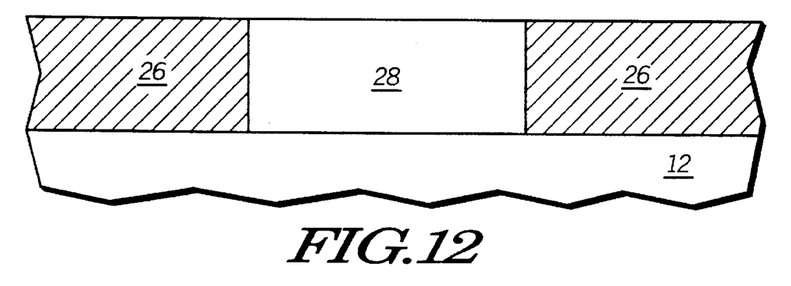
FIGS. 12–15 illustrate, in cross-sectional form, another method for forming a semiconductor structure having an air region in accordance with the present invention.

FIGS. 12–15 illustrate another method wherein a 100% air region may be formed to provide an optimal low-K dielectric region. In FIG. 12, the base layer 12 or substrate is illustrated. The base layer 12 may be a dielectric layer, or a silicon substrate, a polysilicon material, an epitaxial material, amorphous silicon, germanium, gallium arsenide, germanium silicon, or like materials as discussed above. Regions 26 are formed which are similar to regions 14 of FIG. 5. Regions 26 may be a metal or a like conductive layer or may be a dielectric material in other applications. Protective sidewall spacers (not illustrated) may optionally be formed adjacent the regions 26. A plug region, a sacrificial material, or a sacrificial region 28 is formed between the regions 26. A spin on glass (SOG), a deposition and reflow process, a chemical mechanical polishing (CMP) step, a resist etch back (REB) step and/or a like planarization method may be used to form the sacrificial region 28. Sacrificial region 28 is formed of any material which may be etched selective to regions 26. In many cases, the sacrificial region 28 should be etched selective to the base layer 12, although this selectivity is not as critical as the selectivity to regions 26 in most cases.

Sacrificial region 28 may be formed from a material which is water-soluble to ensure a high etch selectivity. In general, sacrificial region 28 may be formed of titanium nitride, silicon nitride, a nitrided material, borophosphosilicate glass (BPSG), borosilicate glass (BSG), boronitride (BN), boro-oxynitride (BNO), titanium oxide, germanium silicon, germanium oxide, ruthenium oxide, polyimide, an organic material, calcium flouride, barium flouride, strontium flouride, a flourided material, a polymeric material, a refractory metal, an oxide, like materials, or any composite thereof.

Figure 13:
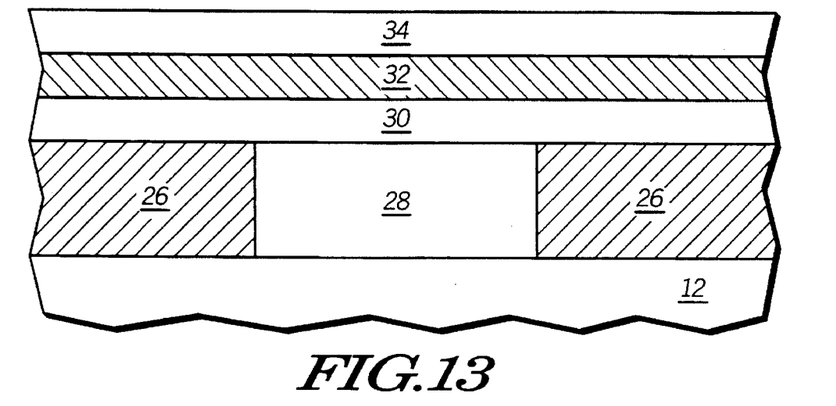

In FIG. 13, a dielectric layer 30 is formed overlying the regions 26 and the sacrificial region 28. The dielectric layer 30 may be formed from any dielectric material, such as wet or dry silicon dioxide ($SiO_2$), a nitride material, tetraethylorthosilicate (TEOS) based oxides, borophosphosilicate glass (BPSG), phosphosilicate glass (PSG), borosilicate glass (BSG), oxide-nitride-oxide (ONO), tantalum pentoxide ($Ta_2O_5$), plasma enhanced silicon nitride ($P-SiN_x$), titanium oxide, oxynitride, composite dielectrics and/or like dielectric materials. Preferably, the dielectric material is a material which cannot easily be selectively grown. In other words, the dielectric material used to form dielectric layer 30 is at least partially growth resistant.

A growth layer or seed layer 32 is formed overlying the dielectric layer 30. An optional dielectric layer 34 which is similar to dielectric layer 30 is formed overlying the seed layer 32. The seed layer 32 is preferably any layer that can be used as a seed source, selectively grown, or epitaxially grown while little or no growth occurs on the dielectric layers 30 and 34. In addition, the seed layer 32 should be capable of being deposited or formed at conditions (i.e. temperature, pressure) which do not adversely affect underlying layers of material. The seed layer 32 may be, for example, silicon, polysilicon, amorphous silicon, germanium, titanium nitride, a metal, a conductive material and/or germanium silicon. Germanium silicon is a preferred seed layer in some embodiments due to the fact that germanium silicon may be deposited at low temperatures and selectively grown at low temperatures (200° C. to 300° C.). These low temperatures would not adversely affect conventional underlying material such as aluminum and the like. Other materials which may be selectively grown may be used as the seed layer 32. In general, dielectric layers 30 and 34 are any material which resists epitaxial or selective growth on material surfaces formed adjacent dielectric layers 30 and 34.

Figure 14:
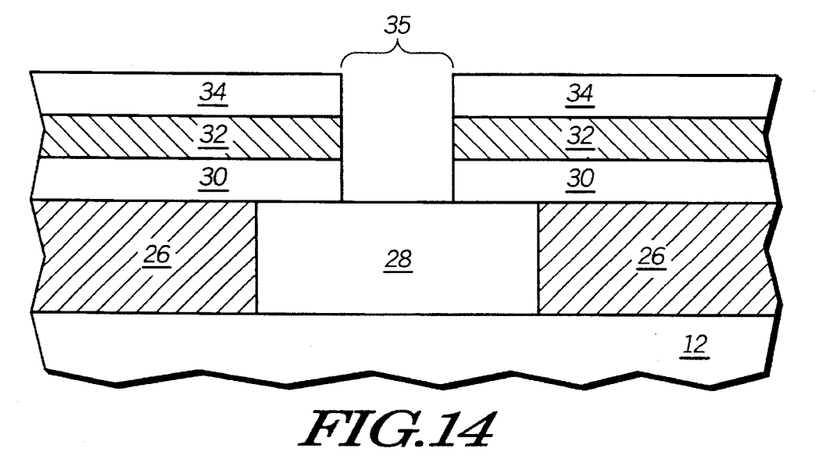

In FIG. 14, an opening 35 is etched through the layers 30, 32, and 34. Silicon nitride and/or TEOS/oxide etching is accomplished via $CHF_3$ or $CF_4$ combined with $O_2$ or $CO_2$ in a plasma environment or a $C_2F_6$ plasma environment. In addition, silicon nitride may be wet etched in a solution of phosphoric acid (($C_2H_5O)_2POOH$) or may be etched via a methanol-based ($CH_3OH$) chemistry. Oxides may be wet etched in an HF solution or buffered HF which is HF mixed with ammonia hydroxide. Seed layers, such as polysilicon, may be etched using a HBr and $Cl_2$ plasma. Germanium silicon may be etched via a (35:20:10) mixture of nitric acid:

water: hydrofluoric acid (0.5%), with a selectivity to single-crystalline silicon of up to 100 to 1. However, other mixtures of this etchant as well as other well-known silicon-germanium wet etchants that have a high etch selectivity to single crystal silicon could also be used. For example, mixtures of hydrofluoric acid:water:hydrogen peroxide, or mixtures of hydrofluoric acid:hydrogen peroxide:acetic acid such as (1:2:3), or mixtures of ammonium hydroxide:hydrogen peroxide:water could also be used. Any of the above stated plasma environments may contain one or more inert carrier gases such as Ar, $H_2$, He, $N_2$, or a like inert carrier gas.

The opening 35 forms a sidewall of the seed layer 32. In addition, the opening 35 exposes at least a top portion of the sacrificial region 28.

Figure 15:
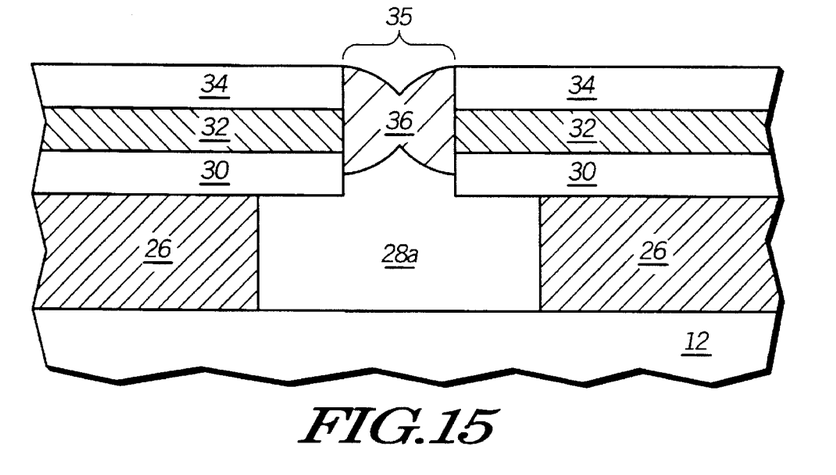

In FIG. 15, an etchant, as discussed above for FIG. 9, is used to remove the sacrificial region 28 selective to the base layer 12, regions 26, and the dielectric layers 30 and 34. Epitaxial material or selective material is grown from the sidewall of the seed layer 32 to form a grown region 36. Grown region 36 seals or closes off a portion of the opening 35 and creates an air gap or air region 28a. Grown region 36 may be formed by exposing the seed layer 32 to one of either $SiH_4$, $SiHCl_3$, $SiH_2Cl_2$, $SiH_3Cl$ or $SiCl_4$ with an optional carrier gas, optional oxygen, or optional HCl if the seed layer is silicon-based. An environment having at least one of either $Si_2H_6$, $SiH_4$, $SiH_3Br$, $SiBrCl_3$, $SiH_2Br_2$, $SiHBr_3$, $SiBr_2Cl_2$, $SiCl_2F_2$, $SiClF_3$, $SiH_3I$, $SiBr_3Cl$, $SiCl_3I$, $SiHF_3$, $Si_3H_8$, $Si_4H_{10}$, $SiH_2Cl_2$, $SiCl_4$, $SiHCl_3$, or $SiF_4$, along with at least one of either $GeH_2Cl_2$, $GeH_4$, $GeBr_4$, $GeH_3Br$, $GeH_3Cl$, $GeF_3Cl$, $GeH_2Br_2$, $GeCl_2F_2$, $GeHBr_3$, $GeHCl_3$, $GeCl_3F$, $GeCl_4$, $GeF_4$, $Ge_2H_6$, $Ge_3H_8$, may be used to form a germanium silicon epitaxial or selective material.

Nitride materials may be selectively grown, therefore the seed layer 32 may be a nitride material. Copper and aluminum may be formed selectively. For example, titanium nitride may be used as a seed layer for a grown copper region. Other selectively grown materials and chemistries are known in the art and any selective material or selective growth chemistry may be used for formation of the seed layer 32. Known remote plasma enhanced chemical vapor deposition (RPECVD) and plasma enhanced chemical vapor deposition (PECVD) technologies may allow other materials to be selectively grown at low temperature (e.g. silicon may be grown at a few hundred degrees Celsius). In other forms silicon may be seeded or grown off of metals or other conductive materials.

If the sacrificial region 28 is water-soluble (i.e. removed via water) and the regions 26 are metal, such as aluminum, a vacuum may be used to remove residual water from the air region 28a before the grown region 36 is formed to prevent subsequent corrosion of the regions 26. As taught above, a gas composition, a vacuum or a like environment may be formed in the air region 28a when the grown region 36 is formed. The air region 28a isolates the regions 26 from each other in an optimal manner with an effective dielectric constant of $K \leq 2.3$. In addition, the seed layer 32, if conductive, may be biased to reduce the $C_3$ capacitance illustrated in FIG. 2, and therefore further improve circuit performance.

It should be noted that an isotropic etch is used to form the air region 28a as illustrated in FIG. 15. An RIE etch or any etch process may be used to form the air region 28a although etch processes other than isotropic etches may result in an air region 28a which is less than 100% of the total isolation between the regions 26 (see FIG. 4). In other words, some sacrificial material from sacrificial region 28 may be left behind after the etch.

Figure 16:
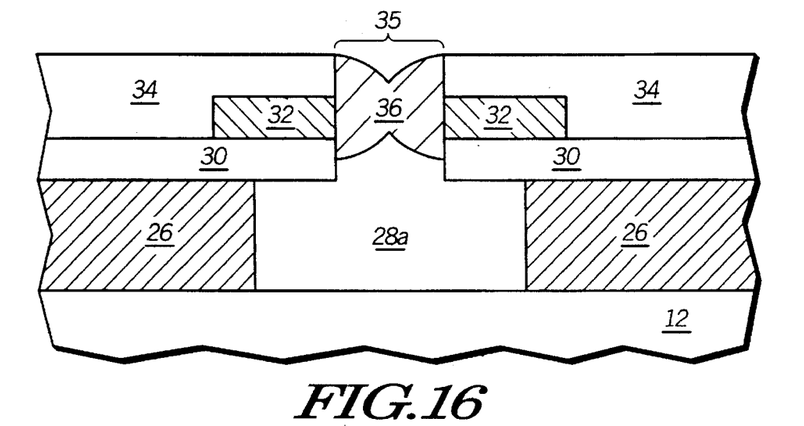
FIG. 16 illustrates, in cross-sectional form, an alternative structure resulting from the method of FIGS. 12–15.

FIG. 16 illustrates that the seed layer 32 may be lithographically patterned and etched or selectively formed so that only select portions of the semiconductor wafer are covered by the seed layer 32. If the seed layer 32 of FIG. 15 is germanium silicon (a conductive layer), the contacting of regions 26 from a top-down direction becomes more difficult. Once a contact hole is opened through the seed layer 32 to expose one of the regions 26, the seed layer 32 must be isolated from the contact so that the seed layer 32 will not electrically short circuit all of the contacts. Therefore, a sidewall oxide or a sidewall spacer must be used within the contact to isolate seed layer 32 from the contact. If seed layer 32 is patterned, as illustrated in FIG. 16, the use of these sidewall oxide and sidewall spacers may not be necessary depending upon the design rules of an integrated circuit.

Figure 17:
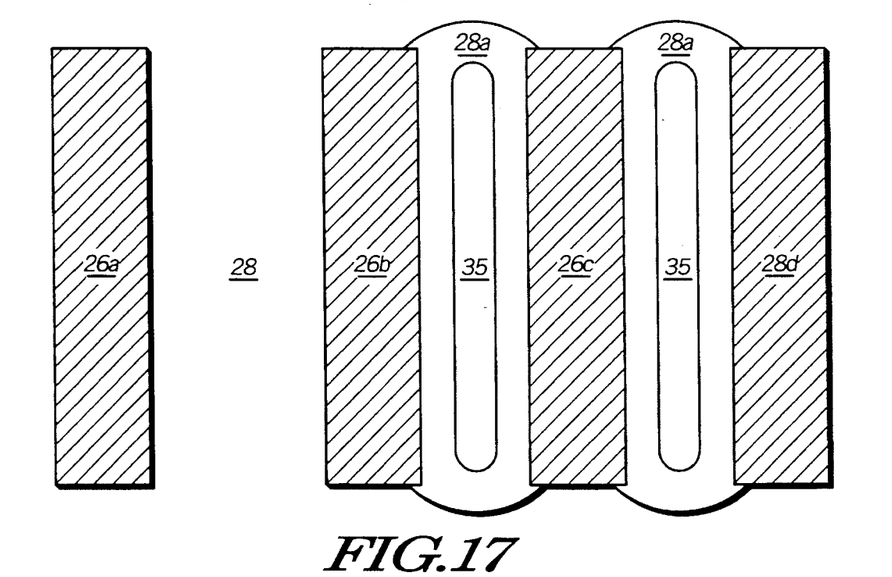
FIG. 17 illustrate, in top perspective view, the top of either one of the structure of FIG. 15 or FIG. 16.

FIG. 17 illustrates a top perspective view of a structure formed in accordance with the method of FIGS. 12–16. In FIG. 17, four conductive regions 26a, 26b, 26c, and 26d are illustrated. Regions 26a and 26b are separated by a distance (i.e. a pitch) which is large enough to avoid damaging capacitive crosstalk. Therefore, the layers 28, 30 and 34 provide adequate isolation between regions 26a and 26b, and no air regions are required between regions 26a and 26b. The regions 26b, 26c, and 26d are closely spaced (i.e. have a small pitch) and are therefore exposed to a damaging capacitive crosstalk phenomenon using conventional dielectric insulators. In order to reduce the damaging crosstalk, the process illustrated in FIGS. 12–15 is used to form the opening 35 between each of the regions 26b, 26c, and 26d. Optionally, phase shifting, X-ray lithography, E-beam processing, advanced photolithography, or other lithographic processes may be used to form the openings 35 having a very small geometry. An etch step selectively removes the sacrificial region 28 between the regions 26b, 26c, and 26d to form air regions 28a. The air regions 28a provide improved selective isolation between the closely spaced conductors (i.e. regions 26b, 26c, and 26d). The opening 35 is closed to seal the air regions 28a by performing selective/epitaxial growth of the seed layer 32 which is not specifically illustrated in FIG. 17.

Figure 18:
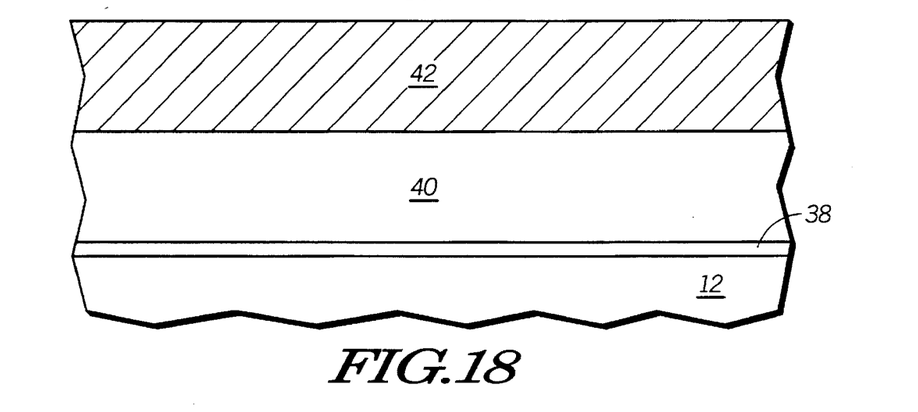
FIGS. 18–24 illustrate, in cross-sectional form, yet another method for forming a semiconductor device having an air region in accordance with the present invention.

FIGS. 18–23 illustrate yet another method for forming a semiconductor structure having an air region. Elements of FIGS. 18–23 which are analogous to preceding elements are identically labeled. FIG. 18 illustrates the base layer 12. A dielectric layer 38 is optionally formed over the base layer 12. The dielectric layer 38 is preferably a thermal pad oxide having a thickness of roughly 500 Angstroms, although any thickness may be used. A sacrificial layer 40 is formed overlying the dielectric layer 38. The sacrificial layer is similar to the region 28 of FIG. 12. A growth layer or seed layer 42 is formed overlying the sacrificial layer 40. Optionally, a dielectric layer may be formed between the layers 40 and 42, and a dielectric layer may be formed above the seed layer 42 in FIG. 18 for isolation purposes. Typical thicknesses of the sacrificial layer 40 range from 1000 Angstroms to 4000 Angstroms, and the seed layer 42 is typically formed having a thickness between roughly 500 Angstroms and 4000 Angstroms. The seed layer 42 is similar to the other seed layers or growth layers discussed herein. Materials and processes used to form and manipulate the sacrificial material have also been taught herein.

Figure 19:
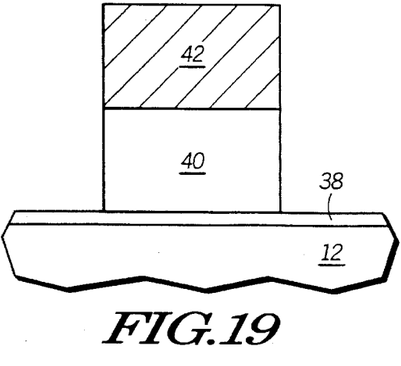

In FIG. 19, the layers 40 and 42 are lithographically patterned and etched to form a patterned layer of material. The lithographic patterning and etching forms a sidewall of the sacrificial layer 40. The dielectric layer 38 functions as an etch stop layer.

Figure 20:
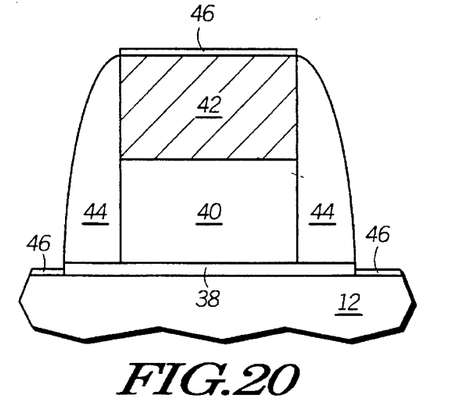

In FIG. 20, a conformal deposition is performed to form a layer of material (not specifically illustrated) adjacent the sidewall of the sacrificial layer 40. This layer of material is reactive ion etched (RIE) or processed in a like manner to form a spacer 44 laterally adjacent the sacrificial layer 40 and the seed layer 42. The spacer 44 may be any sidewall structure such as a sidewall dielectric growth, a lithographic-defined pillar, etc.. The spacer 44 is sometimes referred to generically as being one or more dielectric pillar regions. It should be noted that the pillar regions may be connected together to form one or more cylindrical pillar region. The spacer 44 is formed of a material which will not significantly etch when etching the sacrificial layer of material. For example, if the sacrificial layer 40 is silicon nitride, spacer 44 may be TEOS. If the sacrificial layer 40 is germanium oxide, the spacer 44 may be silicon nitride, and so on. It is important to note that the spacer 44 may be replaced by any sidewall formation other than a sidewall spacer or a patterned layer of material. An oxidation step is performed to form a dielectric layer 46 overlying the seed layer 42. It is important to note that the dielectric layer 46 may have been grown or deposited in FIG. 18 prior to lithographic patterning. In general, the dielectric layer 46 is any material which slows or completely resists selective or epitaxial growth on surfaces which are adjacent or underlying the dielectric layer 46.

Figure 21:
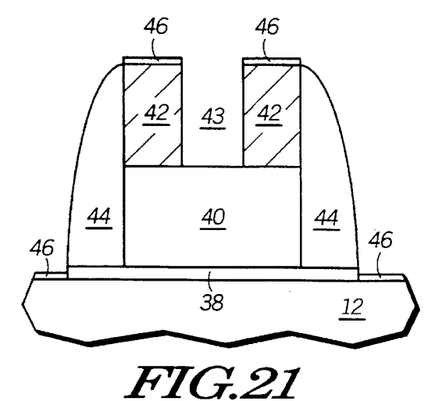

In FIG. 21, an opening 43 having a radius is formed through the seed layer 42 to expose a portion of the sacrificial layer 40. The opening 43 forms an exposed sidewall of the seed layer 42.

Figure 22:
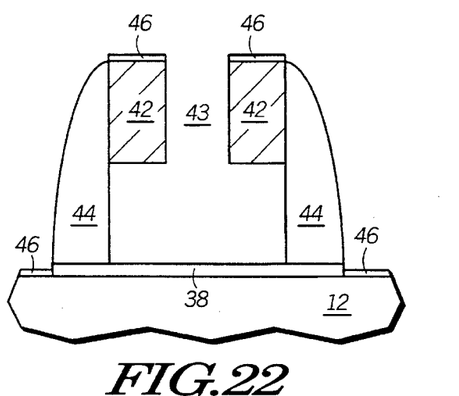

In FIG. 22, the sacrificial layer 40 is removed as taught herein and an air region is formed within the spacer 44. Sacrificial layer 40 may be water soluble or any material as taught or suggested herein.

Figure 23:
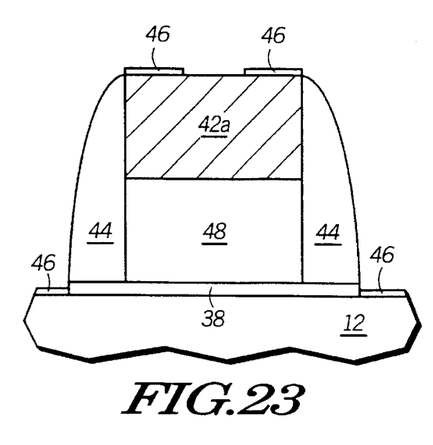

In FIG. 23, a selective growth or epitaxial growth process is used to form a grown region 42a from the seed layer 42. The grown region 42a reduces the radius of the opening 43. The grown region 42a may completely seal the opening 43 and therefore completely isolate an air region 48. In another form, a non-conformal inter-level dielectric (ILD) (not illustrated in FIG. 23) may be used to seal a portion of the opening 43. It is desirable in many cases to use a highly non-conformal selective growth process to form the grown region 42a. A non-conformal selective growth will cause most of the epitaxial growth to occur on top surfaces and exposed sidewall surfaces of the seed layer 42, while the bottom portion of the seed layer 42 which is adjacent the air region 48 contributes little to the growth process. By using this technique of a non-conformal selective process, the air region 48 maintains a more controlled volume due to the fact that the grown region 42a does not encroach much into the air region 48. It should also be noted that any selective process, selective material, or selective chemistry may be used to form the grown region 42a.

Figure 24:
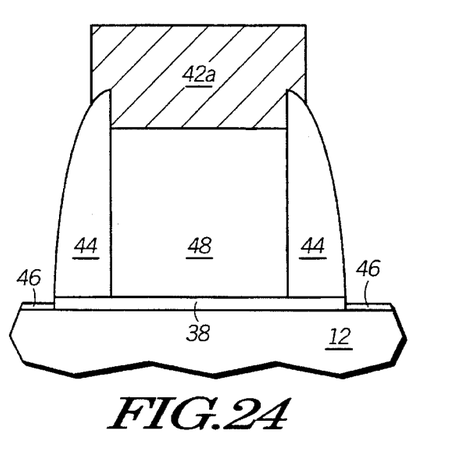

FIG. 24 illustrates that if the dielectric layer 46 is not used in FIG. 23, then the grown region 42a may extend vertically higher than illustrated in FIG. 23 due to unrestricted growth on the top surface of the seed layer 42. The structure of FIGS. 23 and 24 may be used for elevated interconnects having air-isolation regions or other applications as discussed herein.

Figure 25:
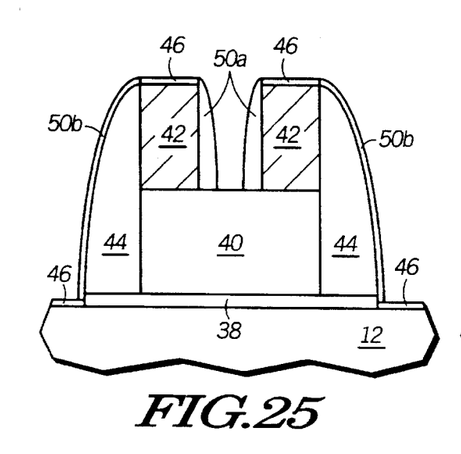
FIGS. 25–27 illustrate, in cross-sectional form, alternative steps which may respectively replace the steps illustrated in FIGS. 21–23.
Figure 26:
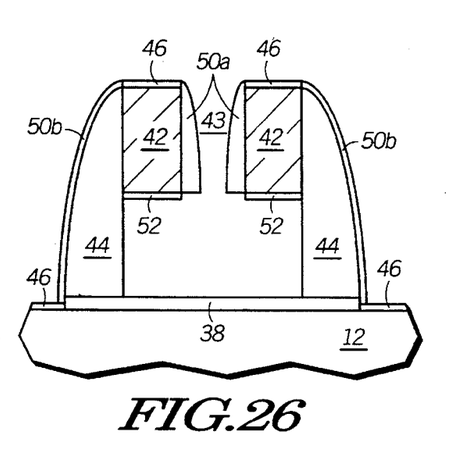
Figures 27, 28:
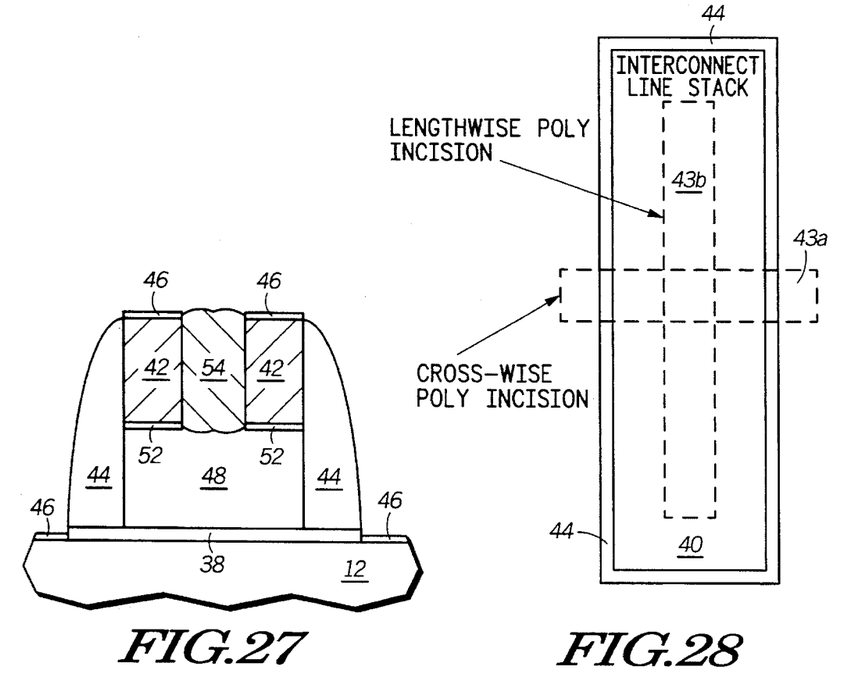
FIG. 28 illustrates, in a top perspective view, either one of the structures illustrated in FIG. 24 or FIG. 27.

FIGS. 25–27 illustrate a method wherein an oxide layer is formed on a bottom portion of the seed layer 42 to further hinder growth into the air region 48. As indicated above, a dielectric layer which resists growth may be deposited between layers 40 and 42 in FIG. 18. Another method for forming the dielectric layer between layers 40 and 42 is illustrated in FIGS. 25–27. FIGS. 25–27 illustrate a process flow which is similar to the flow illustrated in FIGS. 21–23.

FIG. 25 illustrates a structure similar to that illustrated in FIG. 21. In FIG. 25, a spacer 50a is formed laterally adjacent the sidewall of the seed layer 42 which was formed via the opening 43. The spacer 50a should be any material which prevents oxide from forming on the sidewall of the seed layer 42. The sacrificial layer 40 is then removed and a bottom portion of the seed layer 42 is oxidized to form an oxide layer 52 as illustrated in FIG. 26. In FIG. 27, the selective growth or epitaxial growth process is used to isolate the air region 48. The oxide layer 52 ensures that growth on a bottom portion of the seed layer 42 is at a minimum. Due to the fact that nitride is a good oxidation barrier, selective nitride may be formed as the layer 52 when an oxidation step is used to close the opening 43.

FIG. 28 illustrates a top perspective view of the structures illustrated in FIGS. 18–27. FIG. 28 illustrates that the opening 43 may be formed as a perpendicular opening 43a or a parallel opening 43b with respect to the sacrificial material 40.

The air regions taught herein have been illustrated as forming air bridge isolation for conductive regions and/or air isolated interconnects. In the integrated circuit industry, semiconductor substrates are beginning to be used to form small structures and devices known as micromachines. It should be apparent that the air regions taught herein may be used to form many micro-devices and micro-semiconductor-devices such as small pressure transducers, fluorescent light bulbs, gas cavities, filament (incandescent) light bulbs, flat panel displays, a radiation hard integrated circuit vacuum tube, micromachines, vacuum cavities, microstructures, transducers, microtubes, an x-y position scintillation counter/Geiger counter using an array of gas filled microcavities, gas detection devices, various sensors, microvalves, temperature and stress sensors for integrated circuit process monitoring within semiconductor equipment process chambers, etc.. The list of micromechanical semiconductor applications for the above described processes is broad.

For example, the device illustrated in FIG. 27 may function as a semiconductor pressure sensor wherein the layer 42 and region 54 form a control electrode and the air region 48 forms a gate dielectric layer. Pressure on the control electrode alters the dimensions or properties of the air region 48 and alters a threshold voltage of the structure illustrated in FIG. 27. Source and drain regions (not illustrated in FIG. 27) may be formed in the base layer 12 to conduct current. The current through the source and drain (not illustrated) may be correlated to the pressure on the control gate to form a pressure transducer. Temperature may have a similar effect on the device of FIG. 27 depending on the gas concentration of the air region 48.

Figure 29:
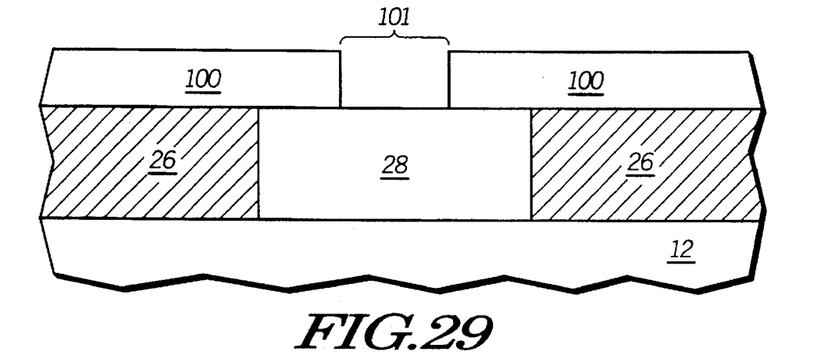
FIGS. 29–31 illustrate, in cross-sectional form, yet another method for forming a semiconductor device having an air region in accordance with the present invention.
Figure 30:
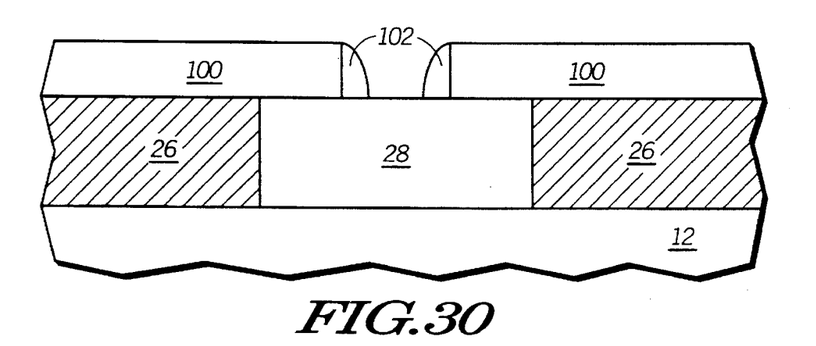
Figure 31:
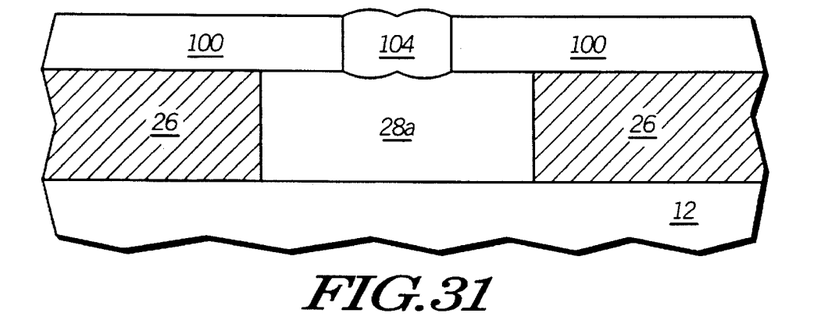

FIGS. 29–31 illustrate another method for forming an air region which is similar to the method illustrated in FIGS. 12–15. Elements in FIGS. 29–31 which are analogous to elements in FIGS. 29–31 are identically labeled. FIG. 29 illustrates regions 26, base layer 12, and sacrificial region 28. A dielectric layer 100 is formed overlying the regions 26 and sacrificial region 28. An opening 101 is formed within the dielectric layer 100. The opening 101 exposes a portion of the sacrificial region 28.

In FIG. 30, a layer of seed material or a layer of growth material is deposited and reactive ion etched (RIE) to form a seed spacer 102 within the opening 101. The seed spacer 102 is formed of a material which is similar to the layer 32 of FIG. 13.

In FIG. 31, an etch process, as taught herein, is used to remove the sacrificial region 28 to form an air region 28a.

Epitaxial or selective growth is performed on the seed spacer 102 to form a grown region 104. The grown region 104 encapsulates and isolates the air region 28a.

Figure 32:
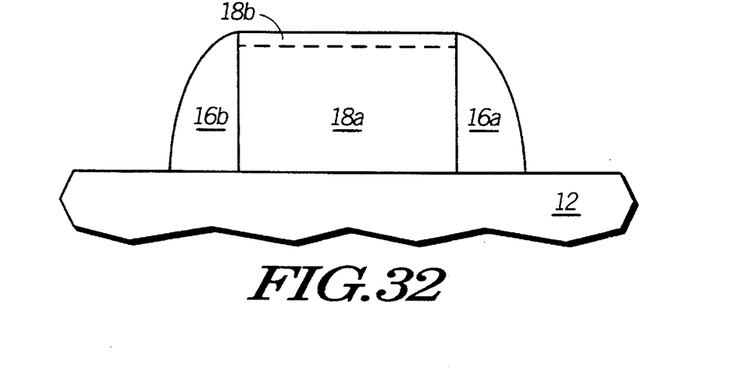
FIGS. 32–35 illustrate, in cross-sectional form, yet another method for forming a semiconductor device having an air region in accordance with the present invention.

FIGS. 32–35 illustrate a method for forming a semiconductor device in a manner similar to the method illustrated in FIGS. 5–11. Elements in FIGS. 32–35 which are analogous to elements in FIGS. 5–11 are identically labeled. FIG. 32 illustrates a plug region 18a. In FIG. 32, the plug region 18a is deposited or grown and subsequently patterned and etched using conventional lithography/etch processing. One or more sidewall spacers, illustrated by sidewall spacers 16a and 16b, are formed laterally adjacent sidewalls of the plug region 18a. In FIG. 32, an optional known polish stop layer may be formed overlying the plug region 18a. The polish stop layer 18b may be deposited and etched along with the plug region 18a in a self-aligned manner.

Figure 33:
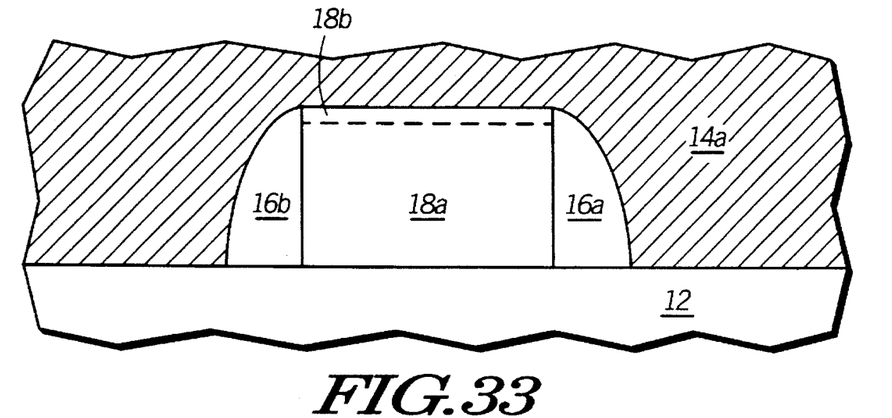

In FIG. 33, metal regions or like conductive material regions (referred to as regions 14) are formed over the plug layer 18a.

Figure 34:
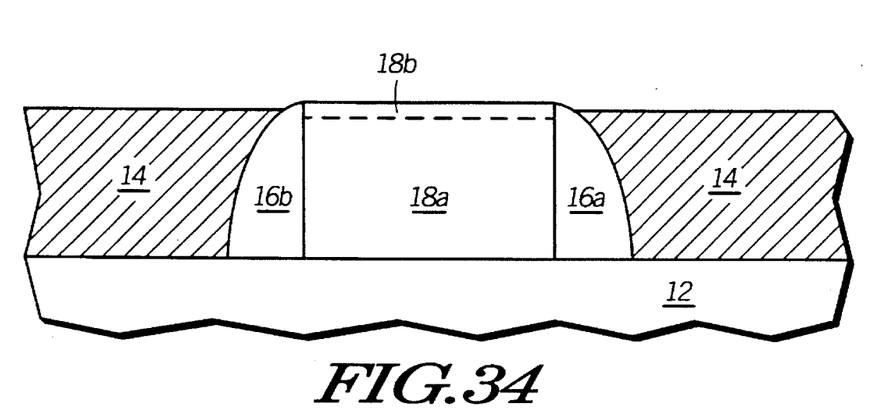

A chemical mechanical polishing (CMP) step or a resist etch back (REB) process is used to planarize the regions 14 as illustrated in FIG. 34. The polishing process illustrated in FIG. 34 exposes a top portion of the spacers 16a and 16b.

Figure 35:
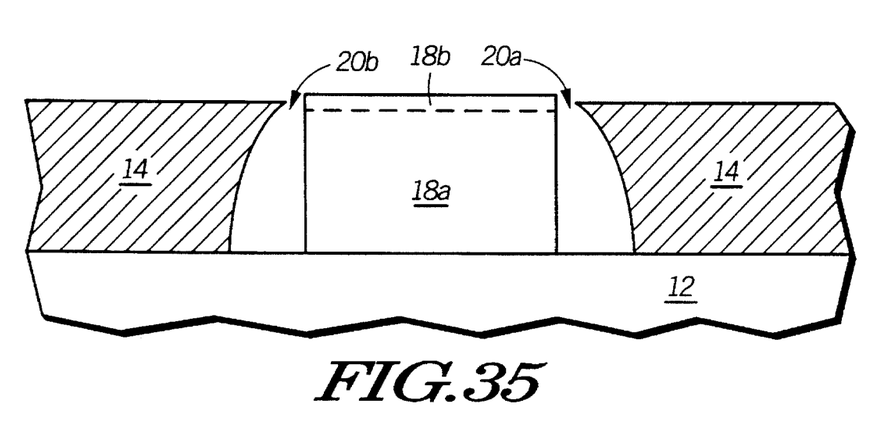

In FIG. 35, the spacers 16a and 16b are removed as taught herein to form air regions 20a and 20b. The air regions 20a and 20b are encapsulated as taught herein. In another form, the plug region 18a is formed as a conductive layer and biased to a ground potential to improve isolation between the regions 14.

While the present invention has been illustrated and described with reference to specific embodiments, further modifications and improvements will occur to those skilled in the art. For example, the various techniques taught herein may be combined on a single substrate to form multiple air region formations. Many of the seed layer materials taught herein are capable of being oxidized. Therefore, if the conductive properties of the seed layer are undesirable, the seed layer may be oxidized after selective/epitaxial growth to transform portions of the conductive seed layer into a dielectric material. Known technologies, such as silicided polysilicon layers, may be added to the processes illustrated and taught herein. Many semiconductor applications exist for the air regions taught herein. It should be apparent that selective oxidation may be used in place of selective growth or epitaxial growth. It is to be understood, therefore, that this invention is not limited to the particular forms illustrated and that it is intended in the appended claims to cover all modifications that do not depart from the spirit and scope of this invention.

We claim:

1. A semiconductor structure comprising:

a first enclosed cavity;

a second enclosed cavity;

a substrate having a top-most surface and an overlying first dielectric layer;

an interconnect conductive layer overlying the first dielectric layer;

a second dielectric layer overlying the first dielectric layer;

a first conductive region overlying the second dielectric layer and having a sidewall, the first enclosed cavity being adjacent the sidewall of the first conductive region;

a second conductive region overlying the second dielectric layer, having a sidewall, and being separated from the first conductive region, the second enclosed cavity being adjacent the sidewall of the second conductive region; and a dielectric region overlying the second dielectric layer and being between the first enclosed cavity and the second enclosed cavity, wherein the first enclosed cavity and the second enclosed cavity are completely overlying a top-most surface of the substrate.

2. The semiconductor structure of claim 1 wherein a non-conformal dielectric layer is formed over both the first and second enclosed cavities to further isolate the first and second enclosed cavities.

3. A semiconductor structure formed on a single substrate comprising:

a dielectric isolation region overlying the substrate;

a first conductive region overlying the dielectric isolation region;

a second conductive region overlying the dielectric isolation region and laterally separated from the first conductive region;

an enclosed cavity between the first conductive region and the second conductive region, wherein the enclosed cavity contains a gas composition different from a gas composition of the atmosphere;

a solid dielectric layer overlying and in contact with the first conductive region and the second conductive region;

a layer of material overlying the dielectric layer and overlying a top portion of the enclosed cavity in order to isolate the enclosed cavity from an ambient air environment; and a dielectric region formed overlying the growth material portion.

4. The semiconductor structure of claim 3 wherein the layer of material is a material which is capable of being selectively grown when exposed to a growth ambient.

5. The semiconductor structure of claim 3 wherein the enclosed cavity has a pressure which is other than atmospheric pressure.

6. A semiconductor structure comprising:

a substrate having a top-most surface;

a dielectric isolation layer formed overlying the substrate;

a first conductive layer of material having a sidewall and being formed overlying the dielectric isolation layer;

a second conductive layer of material formed laterally separated from the first conductive layer of material, the second layer of material having a sidewall which faces the sidewall of the first conductive layer of material and being formed overlying the dielectric isolation layer;

a first air region formed laterally adjacent the sidewall of the first conductive layer of material and overlying the dielectric isolation layer;

a second air region formed laterally adjacent the sidewall of the second conductive layer of material and overlying the dielectric isolation layer; and a dielectric region formed in-between the first air region and the second air region where the first air region, second air region, and the dielectric region isolate the first conductive layer of material from the second conductive layer of material, the first air region and the second air region being completely above the top-most surface of the substrate and only dielectric material including the dielectric region being formed between the first air region and the second air region.

7. The semiconductor structure of claim 6 wherein a non-conformal dielectric layer is formed overlying the first air region.

8. The semiconductor device of claim 6 wherein the first air region is altered from atmospheric air conditions in a manner selected from a group consisting of: altered pressure, altered gas composition.

9. A semiconductor structure comprising:

a base layer;

a first material, which is resistant to a predetermined selective growth chemistry, formed overlying the base layer;

a second material, which is not resistant to the predetermined selective growth chemistry, formed overlying the first material;

a third material, which is resistant to the predetermined selective growth chemistry, formed overlying the second material; and an opening defined through the first material, second material and third material wherein a fourth material, which is coupled to the second material, closes the opening to form an air region beneath the fourth material.

10. The semiconductor structure of claim 9 wherein the air region lies between a first conductive layer and a second conductive layer and is used to electrically isolate the first conductive layer from the second conductive layer.

11. A semiconductor structure formed on a single substrate comprising:

a dielectric isolation region overlying the substrate;

a first conductive region overlying the dielectric isolation region;

a second conductive region overlying the dielectric isolation region and laterally separated from the first conductive region;

an enclosed cavity between the first conductive region and the second conductive region, wherein the enclosed cavity has a pressure which is other than atmospheric pressure;

a solid dielectric layer overlying and in contact with the first conductive region and the second conductive region;

a layer of material overlying the dielectric layer and overlying a top portion of the enclosed cavity in order to isolate the enclosed cavity from an ambient air environment; and a dielectric region formed overlying the growth material portion.

* * * * *